(12) United States Patent
Huang et al.

(10) Patent No.: US 11,049,775 B2
(45) Date of Patent: Jun. 29, 2021

(54) SEMICONDUCTOR DEVICE HAVING FINFET WITH WORK FUNCTION LAYERS AND METHOD OF MANUFACTURING THE SAME

(71) Applicant: Taiwan Semiconductor Manufacturing Co., Ltd., Hsinchu (TW)

(72) Inventors: Yu-Ching Huang, Taichung (TW); Cheng-Chien Li, Hsinchu County (TW); Wen-Li Chiu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 21 days.

(21) Appl. No.: 16/455,646

(22) Filed: Jun. 27, 2019

(65) Prior Publication Data

US 2020/0043809 A1 Feb. 6, 2020

Related U.S. Application Data

(60) Provisional application No. 62/712,221, filed on Jul. 31, 2018.

(51) Int. Cl.
*H01L 21/8238* (2006.01)
*H01L 27/092* (2006.01)
*H01L 29/423* (2006.01)

(52) U.S. Cl.
CPC ......... *H01L 21/823842* (2013.01); *H01L 21/823821* (2013.01); *H01L 27/0924* (2013.01); *H01L 29/42372* (2013.01)

(58) Field of Classification Search
CPC .......... H01L 27/0924; H01L 29/42372; H01L 21/823842; H01L 21/823821
See application file for complete search history.

(56) References Cited

U.S. PATENT DOCUMENTS

| | | | |
|---|---|---|---|
| 8,796,666 B1 | 8/2014 | Huang et al. | |
| 8,815,712 B2 | 8/2014 | Wan et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 10,505,007 B1* | 12/2019 | Su | H01L 21/32134 |
| 2012/0319198 A1* | 12/2012 | Chien | H01L 21/28158 257/333 |

(Continued)

*Primary Examiner* — Lex H Malsawma
(74) *Attorney, Agent, or Firm* — JCIPRNET

(57) ABSTRACT

Provided is a semiconductor device including a first fin-type field effect transistor (FinFET). The first FinFET includes a first gate structure over a first semiconductor fin and the first gate structure includes a first work function layer. The first work function layer includes a first layer and a second layer. The first layer has a bar-shaped structure, the second layer has a U-shaped structure encapsulating sidewalls and a bottom surface of the first layer, and the first layer and the second layer include different materials. A method of manufacturing the semiconductor device is also provided.

20 Claims, 17 Drawing Sheets

(56) References Cited

U.S. PATENT DOCUMENTS

| | | | |
|---|---|---|---|
| 2013/0217220 A1* | 8/2013 | Jagannathan | H01L 21/823821 438/592 |
| 2015/0263004 A1* | 9/2015 | Cheon | H01L 29/66636 257/392 |
| 2019/0148510 A1* | 5/2019 | Chien | H01L 29/785 257/192 |
| 2020/0144387 A1* | 5/2020 | Yang | H01L 29/4966 |

* cited by examiner

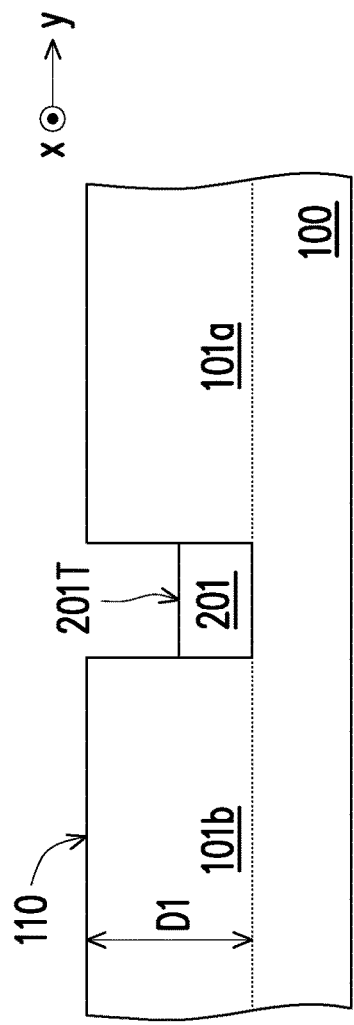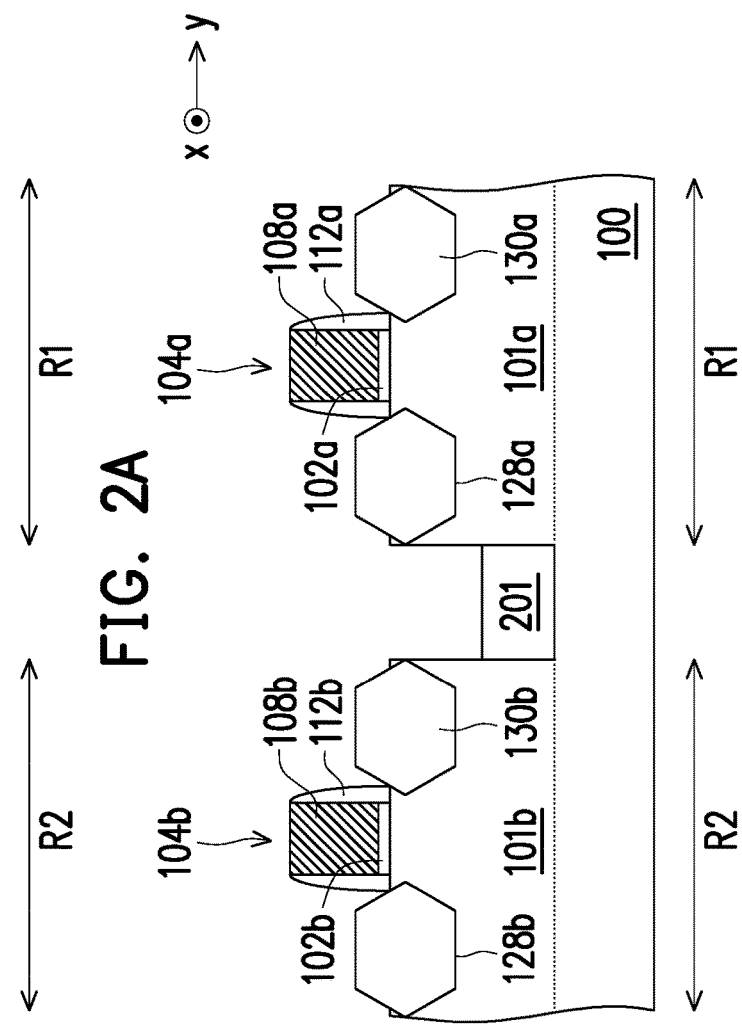

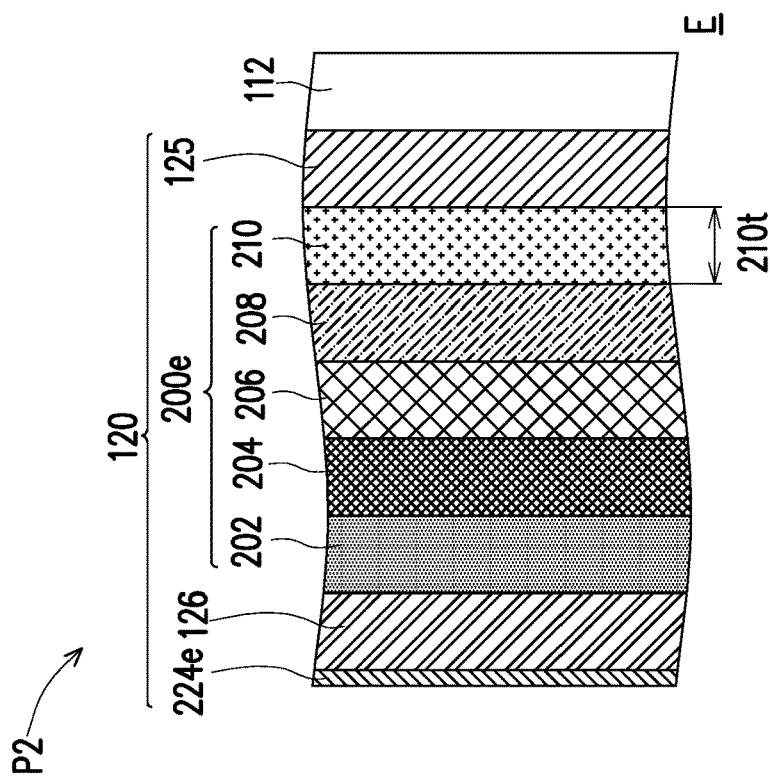
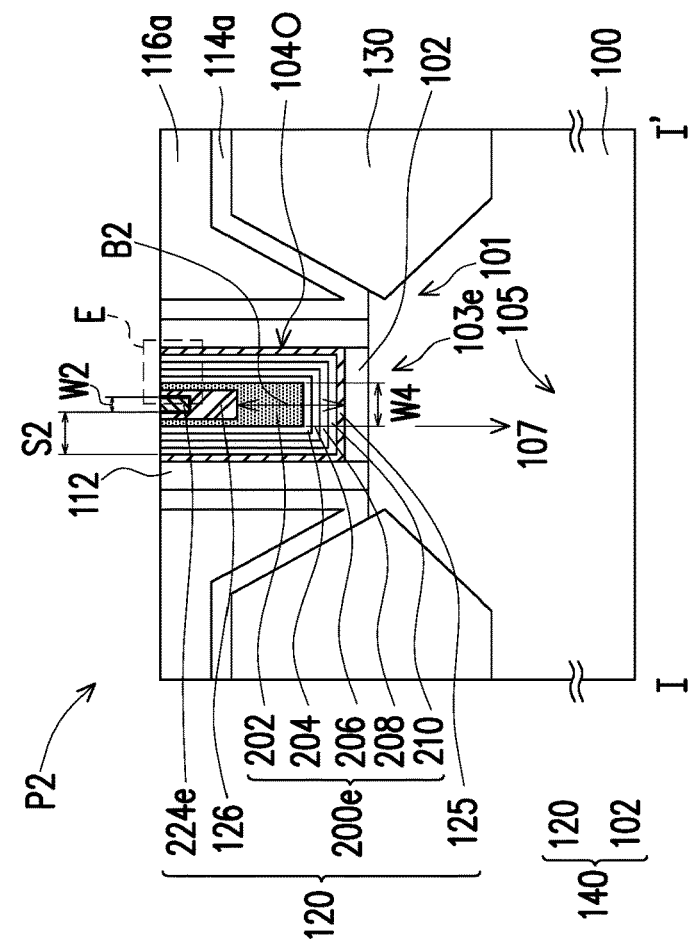
FIG. 5E
FIG. 4E

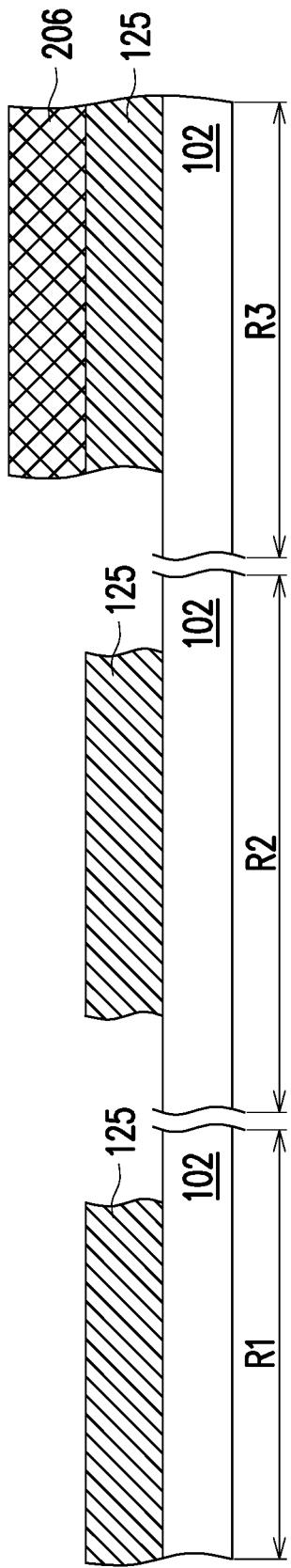
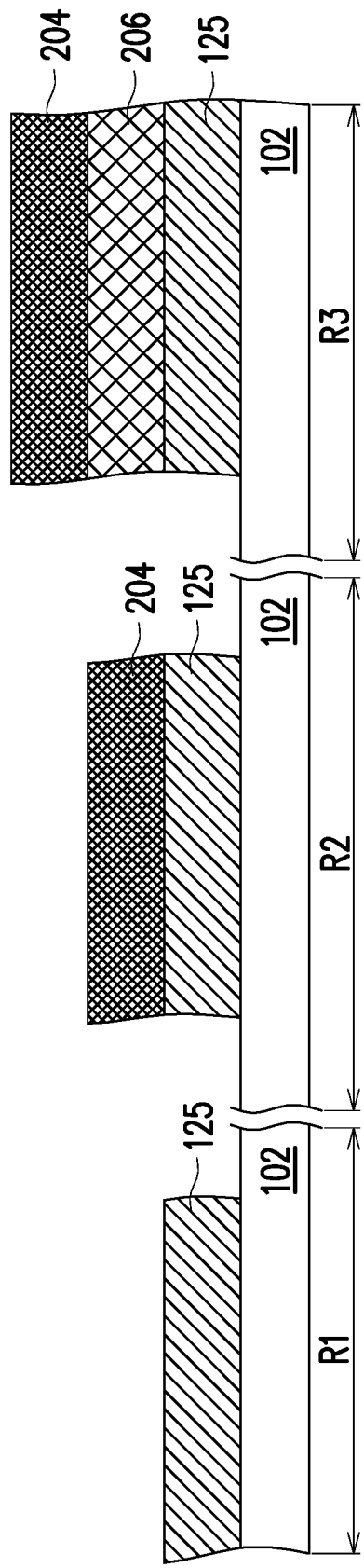

US 11,049,775 B2

SEMICONDUCTOR DEVICE HAVING FINFET WITH WORK FUNCTION LAYERS AND METHOD OF MANUFACTURING THE SAME

CROSS-REFERENCE TO RELATED APPLICATION

This application claims the priority benefit of U.S. provisional application Ser. No. 62/712,221, filed on Jul. 31, 2018. The entirety of the above-mentioned patent application is hereby incorporated by reference herein and made a part of this specification.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET) and the use of a metal gate structure with a high-k (dielectric constant) material. The metal gate structure is often manufactured by using gate replacement technologies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 2E are cross-sectional views of a method of manufacturing a semiconductor device in accordance with some embodiments.

FIGS. 4A to 4F are exemplary cross-sectional views of the various FinFETs taken along the line I-I' of FIG. 3A in accordance with some embodiments.

FIGS. 5A to 5F are enlarged exemplary cross-sectional views corresponding to areas A to F of FIGS. 4A to 4F in accordance with some embodiments.

FIGS. 6A to 6D are exemplary cross-sectional views illustrating various stages of the sequential fabrication process of a gate structure in accordance with some embodiments.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 1:
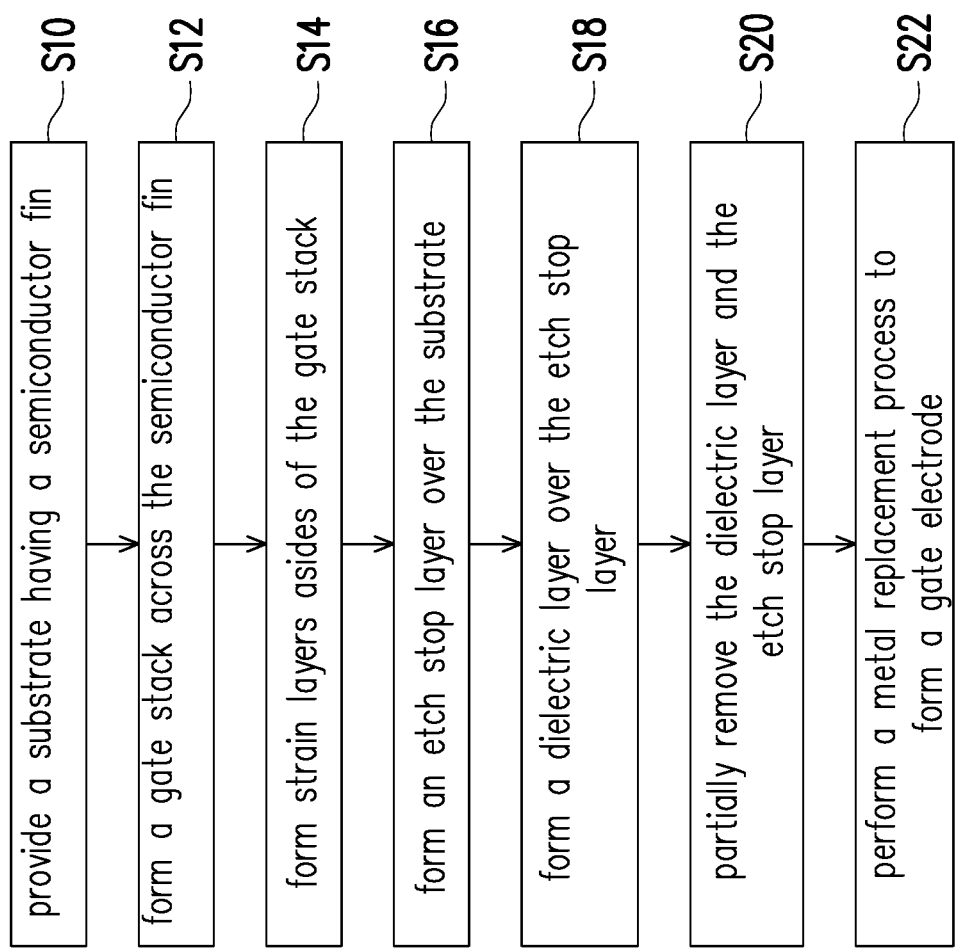
FIG. 1 is a flow chart illustrating a method of manufacturing a semiconductor device in accordance with some embodiments.

FIG. 1 is a flow chart illustrating a method of manufacturing a semiconductor device in accordance with some embodiments. FIGS. 2A to 2E are cross-sectional views of a method of manufacturing a semiconductor device in accordance with some embodiments.

At Step 10 in FIG. 1 and as shown in FIG. 2A, a substrate 100 is provided. The substrate 100 includes a region R1 and a region R2. The region R1 is used for p-type FinFETs, and the region R2 is used for n-type FinFETs, for example. Although the number of each of the regions R1 and R2 illustrated in FIG. 2A is one, it should not limit various embodiments of the present disclosure. In some alternative embodiments, the number of the regions R1 may be three, three regions R1 are used for various p-type FinFET with different threshold voltages, such as an ultra low threshold voltage (uLVT) p-type FinFET, a low threshold voltage (LVT) p-type FinFET, and a standard threshold voltage (SVT) p-type FinFET. Three regions R2 are used for various n-type FinFET with different threshold voltages, such as an uLVT n-type FinFET, a low LVT n-type FinFET, and a SVT n-type FinFET. It will be described in detail in the following paragraphs.

In some embodiments, the substrate 100 includes a bulk substrate, a silicon-on-insulator (SOI) substrate or a germanium-on-insulator (GOI) substrate. In one embodiment, the substrate 100 includes a crystalline silicon substrate (e.g., wafer). The substrate 100 may include various doped regions (such as well regions) depending on design requirements (e.g., p-type substrate or n-type substrate). The doped regions may be doped with p-type or n-type dopants. For example, the doped regions may be doped with p-type dopants, such as boron or $BF_2^+$, n-type dopants, such as phosphorus or arsenic, and/or a combination thereof. In some embodiments, n-type doped regions may be formed in the region R1, and p-type doped regions may be formed in the region R2. In some alternative embodiments, the substrate 100 may be made of some other suitable elemental semiconductors, such as diamond or germanium, a suitable compound semiconductor, such as gallium arsenide, silicon carbide, indium arsenide, or indium phosphide, or a suitable alloy semiconductor, such as silicon germanium carbide, gallium arsenic phosphide, or gallium indium phosphide. Also, in some embodiments, the substrate may include other conductive layers or other semiconductor elements, such as transistors, diodes or the like.

At Step S10 in FIG. 1 and as shown in FIG. 2A, the substrate 100 has semiconductor fins 101a and 101b and isolation structures 201. The semiconductor fins 101a and 101b are formed of a material the same as or different from a material of the substrate 100. In some embodiments, a depth D1 of the semiconductor fins 101a and 101b ranges from 80 nm to 200 nm. The isolation structures 201 include silicon oxide, silicon nitride, silicon oxynitride, a spin-on dielectric material, a low-k dielectric material, or a combination thereof and formed by performing a high-density-plasma chemical vapor deposition (HDP-CVD) process, a sub-atmospheric CVD (SACVD) process or a spin-on process, for example.

As shown in FIG. 2A, in some embodiments, the semiconductor fins 101a and 101b are formed by growing an epitaxial layer (not shown) over the substrate 100, patterning the epitaxial layer to form trenches, forming shallow trench isolation (STI) regions in the trenches, and lowering a top surface of the STI regions by performing an etching process to a level lower than a top surface of the epitaxial layer. The remaining portions of the STI regions become the isolation structures 201, and the remaining portions of the epitaxial layer between the isolation structures 201 thus become the semiconductor fins 101a and 101b. Top surfaces of the isolation structures 201 are lower than top surfaces of the semiconductor fins 101a and 101b. In other words, top portions 110 of the semiconductor fins 101a and 101b protrude from the top surfaces 201T of the isolation structures 201. In one embodiment, the semiconductor fins 101a and 101b include an epitaxial structure containing Si, Ge, or other suitable substrate material. In another embodiment, the semiconductor fins 101a and 101b include an undoped semiconductor material, intrinsic semiconductor material, or a combination thereof. Here, the term "undoped semiconductor material" or "intrinsic semiconductor material" is referred as a pure semiconductor material without any significant dopants species (e.g., n-type or p-type dopants) present.

In some alternative embodiments, the semiconductor fins 101a and 101b are formed by forming trenches in the substrate 10, forming STI regions in the trenches, and lowering a top surface of the STI regions by performing an etching process to a level lower than an original top surface of the substrate 100. The remaining portions of the STI regions become the isolation structures 201, and the remaining portions of the substrate 100 between the isolation structures 201 thus become the semiconductor fins 101a and 101b. Top surfaces of the isolation structures 201 are lower than top surfaces of the semiconductor fins 101a and 101b. In other words, top portions 110 of the semiconductor fins 101a and 101b protrude from the top surfaces 201T of the isolation structures 201.

In some other embodiments, the semiconductor fins 101a and 101b are formed of a material different from a material of the substrate 100. The semiconductor fins 101a and 101b may be formed by lowering top portions of the substrate 100 between the adjacent isolation structures 201 to form recesses (not shown), and re-growing a semiconductor material different from the material of the substrate 100 in the recesses. Top portions of the STI regions may then be removed by performing a chemical mechanical polish process and an etching process, while bottom portions of the STI regions are not removed. As a result, the remaining portions of STI regions become the isolation structures 201, and top portions of the re-grown semiconductor material between the adjacent isolation structures 201 become the semiconductor fins 101a and 101b.

At Step S12 in FIG. 1 and as shown in FIG. 2B, gate stacks 104a and 104b are formed across the semiconductor fins 101a and 101b respectively. In one embodiment, an extending direction X of the gate stacks 104a and 104b is, for example, perpendicular to an extension direction Y of the semiconductor fins 101a and 101b, so as to cover middle portions of the semiconductor fins 101a and 101b. In some embodiments, the gate stack 104a includes a gate dielectric layer 102a and a gate electrode 108a. Similarly, the gate stack 104b includes a gate dielectric layer 102b and a gate electrode 108b. In alternative embodiments, the gate stacks 104a and 104b further include spacers 112a and 112b respectively.

In alternative embodiments, the gate stack 104a or 104b may further include interfacial layers (ILs) on the semiconductor fin 101a or 101b. In other words, the gate dielectric layer 102a or 102b is formed between the IL and the gate electrode 108a or 108b respectively. In some embodiments, the IL includes a dielectric material, such as silicon oxide or silicon oxynitride. The IL is formed by performing a thermal oxidation process, a chemical vapor deposition (CVD) process, or an atomic layer deposition (ALD) process. It should be noted that the detail described below with respect to the elements of the gate stacks 104a may also apply to the elements of the gate stack 104b, and thus the description of the elements in the gate stack 104b is omitted.

The gate dielectric layer 102a is formed to cover portions of the semiconductor fins 101a. In some embodiments, the gate dielectric layer 102a includes silicon oxide, silicon nitride, silicon oxynitride, high-k dielectric materials, or a combination thereof. The high-k dielectric materials are generally dielectric materials with a dielectric constant higher than 4. The high-k dielectric materials include metal oxide. In some embodiments, examples of the metal oxide used as the high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or a combination thereof. The gate dielectric layer 102a is formed by performing a thermal oxidation process, a CVD process, an ALD process, or a combination thereof.

The gate electrode 108a is formed on the gate dielectric layer 102a. In some embodiment, the gate electrode 108a serves as dummy gate electrode, and the gate electrode 108a is made of polysilicon. A metal gate (also referred to as "replacement gates") may replace the dummy gate electrode in subsequent steps. The replacing step will be discussed in greater detail in subsequent paragraphs.

As shown in FIG. 2B, the spacers 112a are formed over sidewalls of the gate electrode 108a. The spacers 112a are formed of silicon oxide, silicon nitride, silicon oxynitride, silicon carbide, SiCN, fluoride-doped silicate glass (FSG), low-k dielectric materials (such as or SiCON), or a combination thereof. It should be noted that the low-k dielectric materials are generally dielectric materials having a dielectric constant lower than 3.9. The spacers 112*a* may have a multi-layer structure including one or more liner layers. The liner layer includes a dielectric material such as silicon oxide, silicon nitride, and/or other suitable materials. The formation of the spacers 112*a* may be achieved by depositing a suitable dielectric material and anisotropically etching off the dielectric material.

As shown in FIG. 2B, recesses 128*a* and 128*b* are formed within the semiconductor fin 101*a* and 101*b* beside the gate stacks 104*a* and 104*b* by removing a portion of the semiconductor fins 101*a* and 101*b* at locations intended for source and drain regions. In some embodiments, the formation of the recesses 128*a* and 128*b* includes performing a first etching process and a second etching process. Here, the first etching process refers to a trench etching process such as an anisotropic etching process, and the second etching process refers to a lateral etching process such as an isotropic etching process.

At Step S14 in FIG. 1 and as shown in FIG. 2B, a strain layer 130*a* is formed in recess 128*a* of the semiconductor fin 101*a* in the region R1. The strain layer 130*a* is formed at sides of the gate stack 104*a*. A lattice constant of the strain layer 130*a* is different from a lattice constant of the substrate 100 (or a lattice constant of the semiconductor fin 101*a*), and portions of the semiconductor fin 101*a* covered by the gate stack 104*a* is strained or stressed to enhance carrier mobility and performance of the FinFETs. In one embodiment, the strain layer 130*a*, such as SiGe, are utilized for hole mobility enhancement of the p-type FinFET to be formed in the region R1.

In addition, a strain layer 130*b* is formed in the semiconductor fin 101*b* in the region R2. A lattice constants of the strain layer 130*b* is different from the lattice constant of the substrate 100 (or a lattice constant of the semiconductor fin 101*b*), and portions of the semiconductor fin 101*b* covered by the gate stack 104*b* is strained or stressed to enhance the carrier mobility and performance of the FinFETs. In one embodiment, the strain layer 130*b* such as SiC or SiP, are utilized for electron mobility enhancement of the n-type FinFET to be formed in the region R2.

In some embodiments, the strain layers 130*a* and 130*b* are formed through epitaxial growth. In some embodiments, the epitaxial growth technology includes performing a low-pressure CVD (LPCVD) process, an atomic layer CVD (ALCVD) process, an ultrahigh vacuum CVD (UHVCVD) process, a reduced pressure CVD (RPCVD) process, a molecular beam epitaxy (MBE) process, a metalorganic vapor phase epitaxy (MOVPE) process or a combination thereof. Alternatively, the epitaxial growth technology utilizes a cyclic deposition-etch (CDE) epitaxy process or a selective epitaxial growth (SEG) process to form the strained material of high crystal quality. In some embodiments, a material of the strain layers 130*a* includes a p-type dopant (such as boron or $BF_2^+$) doped therein formed through selective epitaxial growth by performing in-situ doping, and a material of the strain layer 130*b* includes an n-type dopant (such as phosphorus or arsenic) doped therein formed through selective epitaxial growth by performing in-situ doping.

Figure 2C:
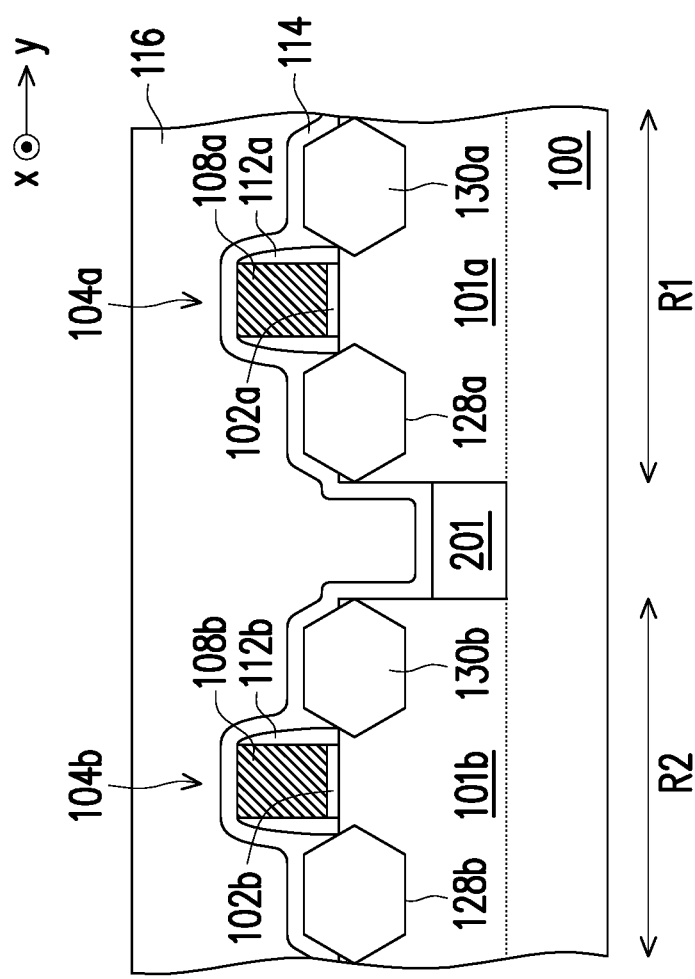

At Step S16 in FIG. 1 and as shown in FIG. 2C, an etch stop layer 114 is formed over the substrate 100. In some embodiments, the etch stop layer 114 may be referred to as a contact etch stop layer (CESL). The etch stop layer 114 includes silicon nitride, carbon-doped silicon nitride, or a combination thereof. In some embodiments, the etch stop layer 114 is deposited by performing a CVD process, a high-density plasma (HDP) CVD process, a sub-atmospheric CVD (SACVD) process, a molecular layer deposition (MLD) process, or other suitable processes. In some embodiments, before the etch stop layer 114 is formed, a buffer layer (not shown) may be formed over the substrate 100. In an embodiment, the buffer layer is an oxide such as silicon oxide. However, other compositions may be possible. In some embodiments, the buffer layer is deposited by performing a CVD process, a HDPCVD process, a SACVD process, an MLD process, or other suitable processes.

At Step S18 in FIG. 1 and as shown in FIG. 2C, a dielectric layer 116 is formed over the etch stop layer 114. In some embodiments, the dielectric layer 116 may be referred to as an interlayer dielectric layer (ILD). The dielectric layer 116 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the dielectric layer 116 includes low-k dielectric materials. It should be noted that the low-k dielectric materials are generally dielectric materials having a dielectric constant lower than 3.9. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the dielectric layer 116 may include one or more dielectric materials and/or one or more dielectric layers. In some embodiments, the dielectric layer 116 is formed to have a suitable thickness by performing a flowable CVD (FCVD) process, a CVD process, a HDPCVD process, a SACVD process, a spin-on process, a sputtering process, or other suitable processes.

Figure 2D:
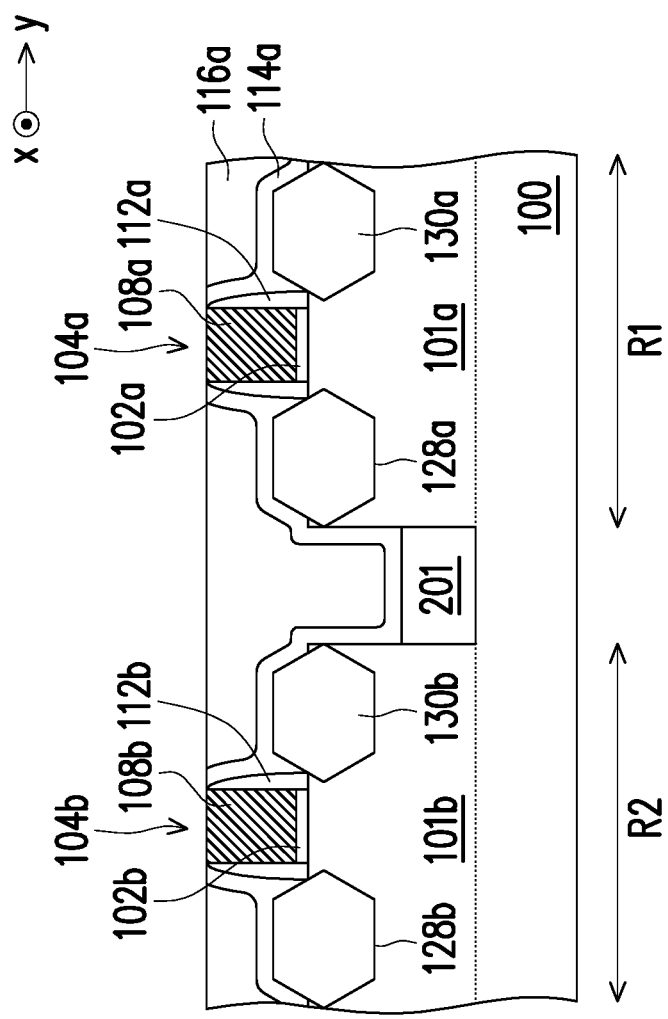

At Step S20 in FIG. 1 and as shown in FIG. 2D, the dielectric layer 116 and the etch stop layer 114 are partially removed such that top surfaces of the gate stacks 104*a* and 104*b* are exposed, and a dielectric layer 116*a* and an etch stop layer 114*a* are formed. The process of removing a portion of the dielectric layer 116 and a portion of the etch stop layer 114 is achieved by a chemical mechanical polishing (CMP) process, an etching process, or other suitable processes.

Figure 2E:
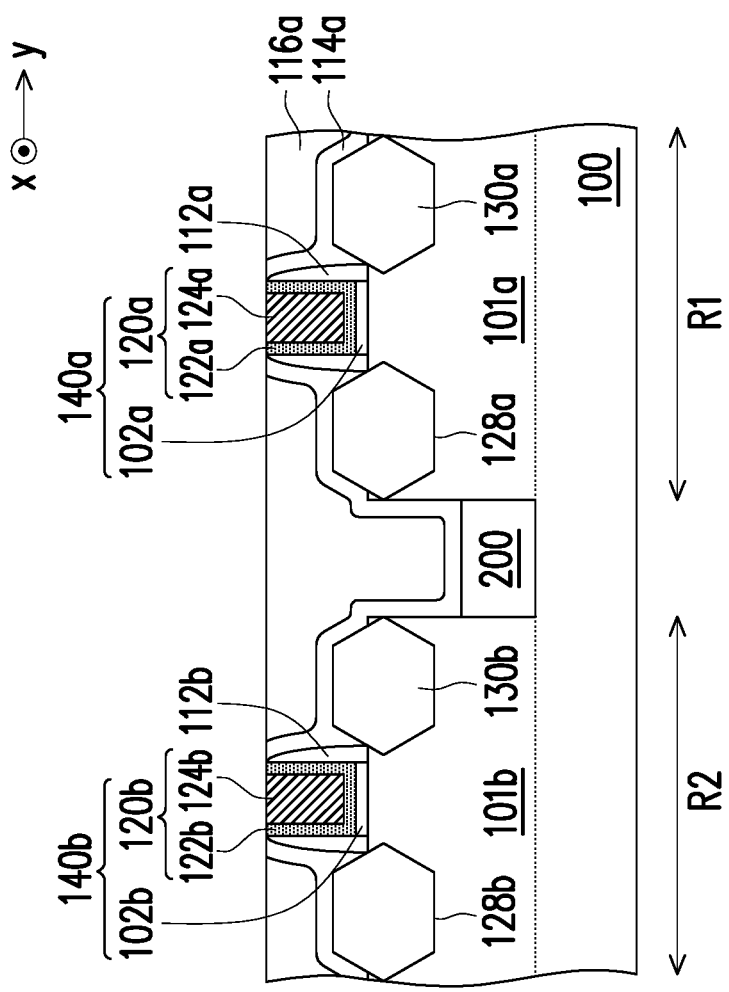

At Step S22 in FIG. 1 and as shown in FIGS. 2D and 2E, a metal replacement process is performed. In some embodiments, the gate electrodes 108*a* and 108*b* are dummy gate electrodes, and are replaced respectively by gate electrodes 120*a* and 120*b*. Specifically, materials of the gate electrodes 108*a* and 108*b* are polysilicon and the materials of the gate electrodes 120*a* and 120*b* include metal-containing conductive layers. At least one of the metal-containing conductive layers includes a barrier, a work function layer, a seed layer, an adhesion layer, a barrier layer, a filter layer, a metal filling layer or a combination thereof. The metal-containing conductive layers include Al, Cu, W, Ti, Ta, Ag, Ru, Mn, Zr, TiAl, TiN, TaN, WN, TiAlN, TaC, TaCN, TaSiN, TiSiN, NiSi, CoSi, or a combination thereof, for example. The metal-containing conductive layers are formed by forming metal-containing conductive material layers, and a chemical mechanical polishing (CMP) process, an etching process, or other suitable processes.

In some embodiments, the gate electrode 120a includes a work function layer 122a and a metal filling layer 124a for the p-type FinFET. The gate electrode 120b includes a work function layer 122b and a metal filling layer 124b for the n-type FinFET. As shown in FIG. 2E, the work function layers 122a and 122b have a U-shape cross section, respectively. The metal filling layer 124a and 124b are disposed over the work function layers 122a and 122b, and are surrounded by the work function layers 122a and 122b, respectively. In the case, the gate dielectric layer 102a and the gate electrode 120a constitute a gate structure 140a for the p-type FinFET, while the gate dielectric layer 102b and the gate electrode 120b constitute of a gate structure 140b for the n-type FinFET. The spacers 112a are formed over the opposite sidewalls of the gate structure 140a; while the spacers 112b are formed over the opposite sidewalls of the gate structure 140b.

Figure 3A:
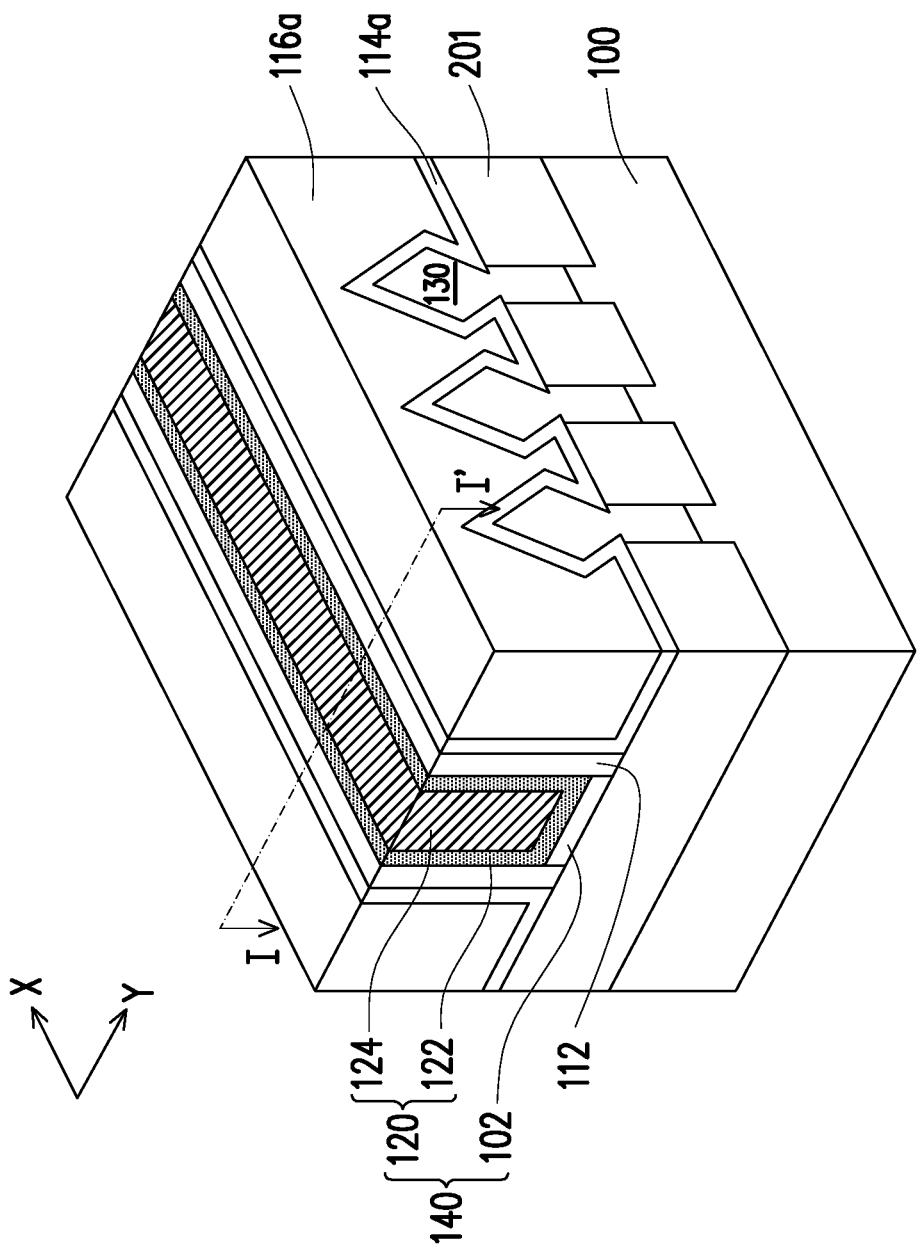
FIG. 3A is a perspective view of a FinFET in accordance with some embodiments.
Figure 3B:
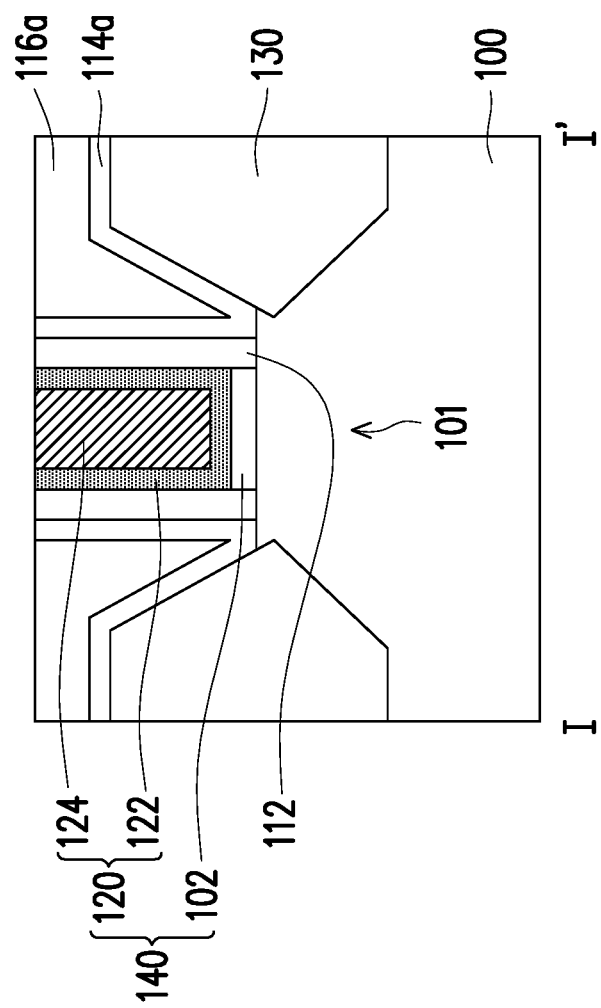
FIG. 3B is a cross-sectional view of the FinFET taken along the line I-I' of FIG. 3A.

FIG. 3A is a perspective view of a FinFET in accordance with some embodiments. FIG. 3B is a cross-sectional view of the FinFET taken along the line I-I' of FIG. 3A. In some embodiments, the FinFET illustrated in FIG. 3A is referred as the FinFET over the substrate 100 in the region R1 and/or region R2 illustrated in FIG. 2E.

As shown in FIG. 3A and FIG. 3B, a FinFET includes a substrate 100, a plurality of isolation structures 201, a gate structure 140, and a plurality of strain layers 130. The substrate 100 has a plurality of semiconductor fins 101. The isolation structures 201 are located over the substrate 100 to isolate the semiconductor fins 101. The semiconductor fins 101 and the isolation structures 201 both extend along the Y direction. In addition, the semiconductor fins 101 protrude from the isolation structures 201. The gate structure 140 extend along the X direction. The gate structure 140 is disposed across portions of the semiconductor fins 101 and portions of the isolation structures 201. In detail, the gate structure 140 includes a gate dielectric layer 102 and a gate electrode 120 over the gate dielectric layer 102. The gate electrode 120 includes a work function layer 122 and a metal filling layer 124 surrounded by the work function layer 122. The strain layers 130 formed at two sides of the gate structure 140 (as shown in FIG. 3B) are referred as source and/or drain (S/D) regions. The FinFET further includes spaces 112, an etch stop layer 114a, and a dielectric layer 116a. The spaces 112 are disposed over the opposite sidewalls of the gate structure 140. The etch stop layer 114a is formed to cover the spaces 112, the strain layers 130, and the isolation structures 201. The dielectric layer 116a is formed over the etch stop layer 114a.

Figure 5A:
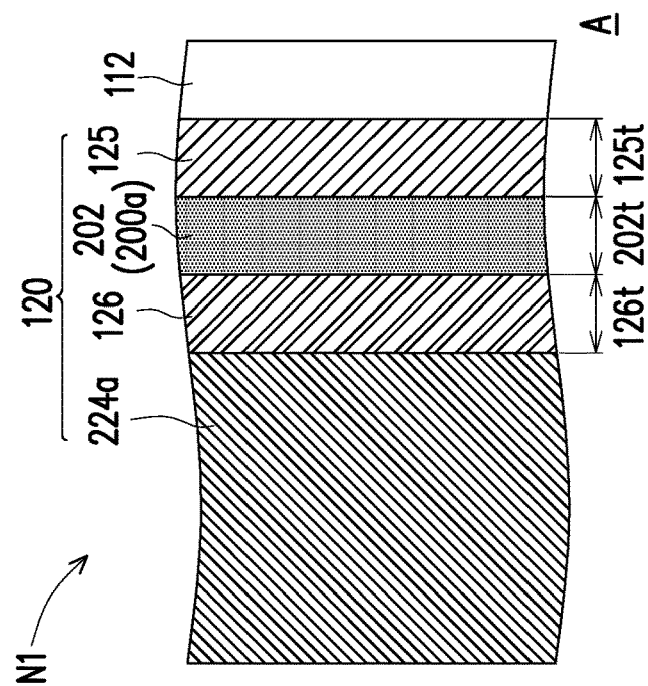

FIGS. 4A to 4F are exemplary cross-sectional views of the various FinFETs taken along the line I-I' of FIG. 3A in accordance with some embodiments. FIGS. 5A to 5F are enlarged exemplary cross-sectional views corresponding to areas A to F of FIGS. 4A to 4F in accordance with some embodiments. FIGS. 5A to 5C show exemplary structures of the work function layer corresponding to areas A to C of FIGS. 4A to 4C for n-type FinFETs with different threshold voltages. In some alternatively embodiments, FIGS. 5D to 5F show exemplary structures of the work function layer corresponding to areas D to F of FIGS. 4D to 4F for p-type FinFETs with different threshold voltages.

FIG. 5A is exemplary cross-sectional view illustrating the structure of the work function layer of a first n-type FinFET N1 with a threshold voltage Vn1 (e.g., ultra-low voltage). FIG. 5B is exemplary cross-sectional view illustrating the structure of the work function layer of a second n-type FinFET N2 with a threshold voltage Vn2 (e.g., low-voltage). FIG. 5C is exemplary cross-sectional view illustrating the structure of the work function layer of a third n-type FinFET N3 with a threshold voltage Vn3 (e.g., standard voltage). Here, $0V<Vn1<Vn2<Vn3$.

Figure 4A:
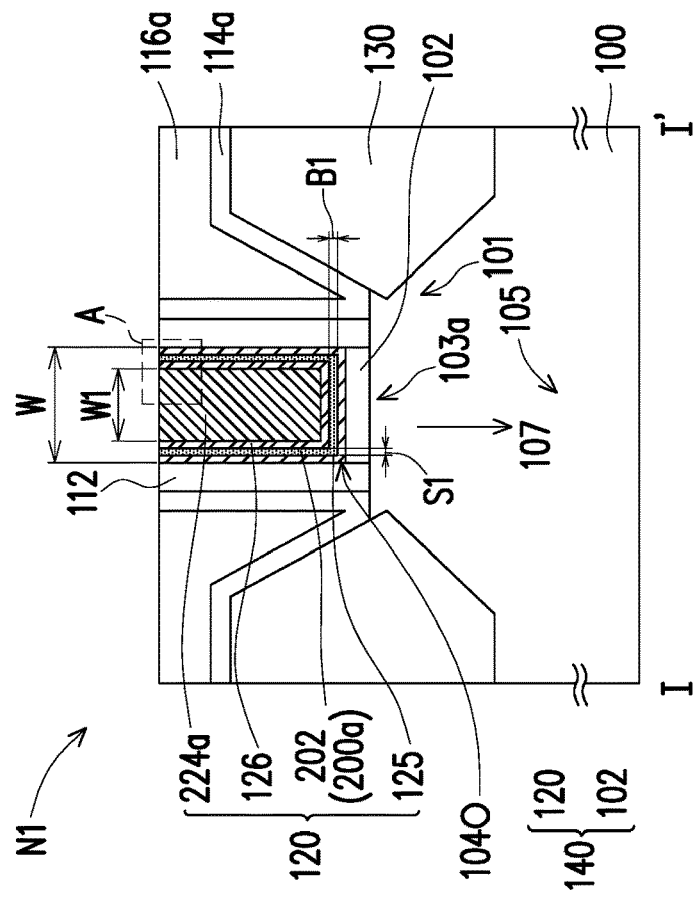
Figure 5B:
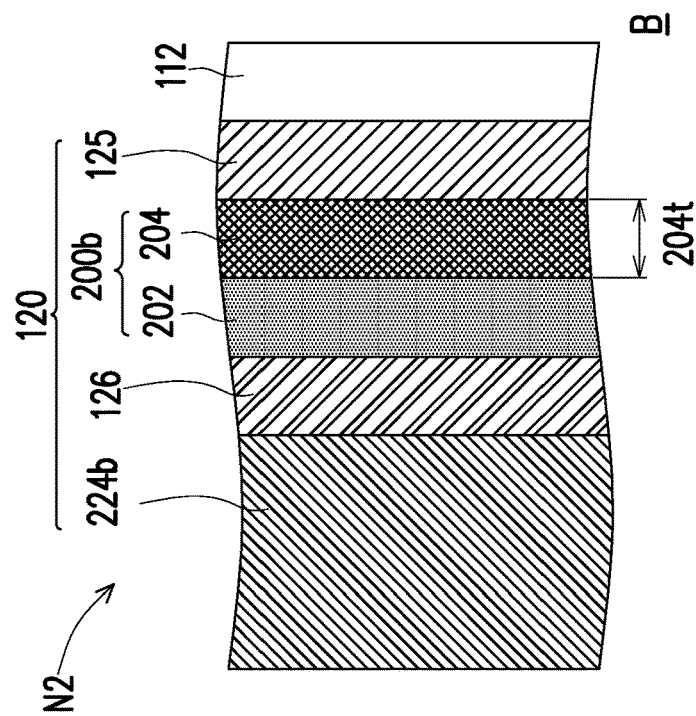
Figure 5C:
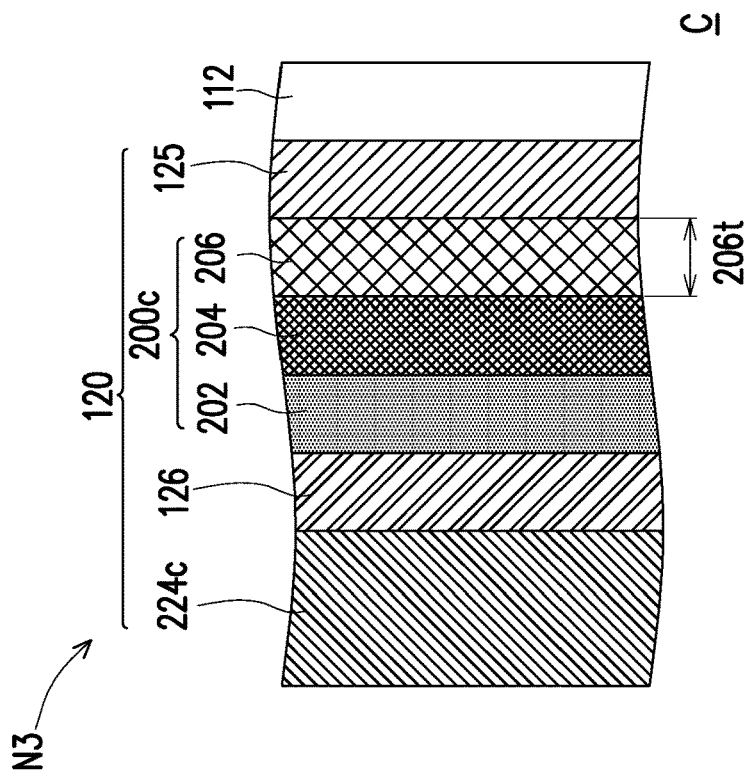
Figure 5D:
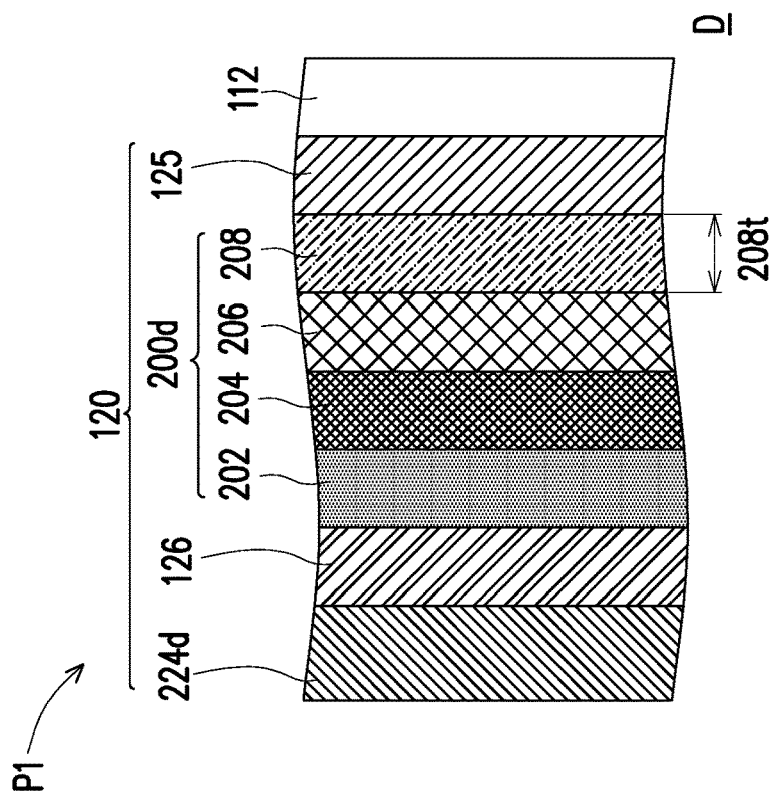
Figure 5F:
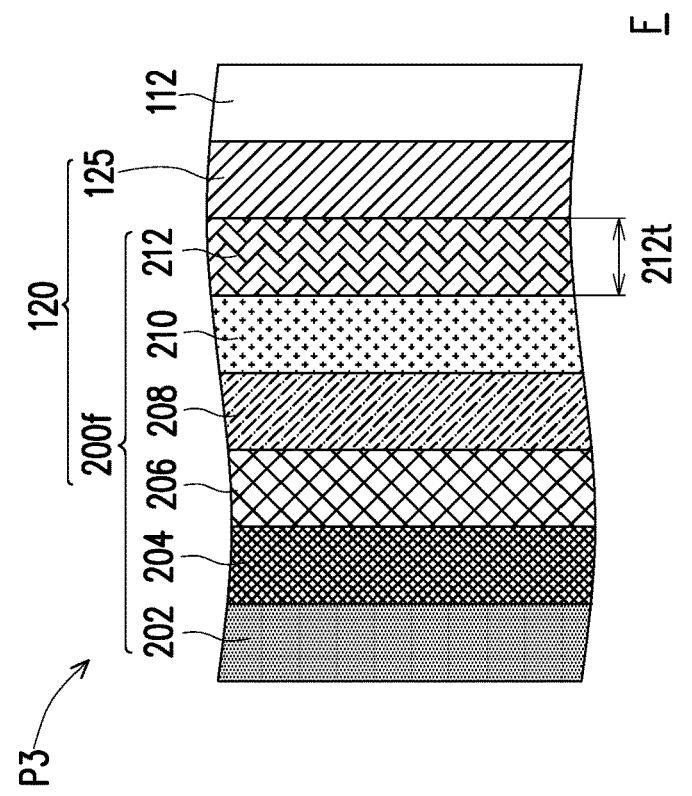

As shown in FIGS. 4A and 5A, the structure of the work function layer of the first n-type FinFET N1 includes a first conductive layer 125, a first layer 202, and a second conductive layer 126 between the spacers 112 and the metal filling layer 224a. In some embodiments, the first conductive layer 125, the first layer 202, and the second conductive layer 126 are formed as U-shaped structures. The first conductive layer 125 is conformally formed over a gate trench 104O, and the first layer 202 is conformally formed over the first conductive layer 125. The second conductive layer 126 is conformally formed over the first layer 202. The metal filling layer 224a is formed as a block structure over the second conductive layer 126. In other words, the first layer 202 is disposed between the first conductive layer 125 and the second conductive layer 126, and the metal filling layer 224a is engaged with the second conductive layer 126.

In some embodiments, the first conductive layer 125 functions as a barrier or protective layer in the subsequent etching processes, is conformally formed over the gate trench 104O, and covers the gate dielectric layer 102 and the spacers 112. In some embodiments, the first conductive layer 125 includes one or more layers of Ti, Ta, TiN and TaN. For example, the first conductive layer 125 may be a single TaN layer, or a composite layer of a TaN layer formed over a TiN layer. The first conductive layer 125 is formed by performing a CVD process, an ALD process, or other suitable process. A thickness 125t of the first conductive layer 125 is in a range from 5 Å to 25 Å, in some embodiments.

The first layer 202 is also referred as a first work function layer 200a. As shown in FIG. 4A, the first layer 202 conformally covers the first conductive layer 125 and is formed as the U-shaped structure. In some embodiments, the first layer 202 includes TiAl, TaAl, HfAl, or a combination thereof. In some embodiments, the first layer 202 includes one or more layers. The first layer 202 and the first conductive layer 125 include different materials or the same material. The first layer 202 is formed by performing a CVD process, an ALD process, or other suitable process. A thickness 202t of the first layer 202 is in a range from 15 Å to 50 Å, in some embodiments, and in a range from 25 Å to 40 Å in other embodiments.

In some embodiments, the second conductive layer 126 functions as an adhesive layer for the metal filling layer 224a. As shown in FIG. 4A, the second conductive layer 126 conformally covers the first layer 202 and is formed as the U-shaped structure. In some embodiments, the second conductive layer 126 includes one or more layers of Ti, Ta, TiN and TaN. In one embodiment, a TiN layer is used as the second conductive layer 126. In some embodiments, the second conductive layer 126 and the first layer 202 include different materials or the same material. The second conductive layer 126 is formed by performing a CVD process, an ALD process, or other suitable process, for example. A thickness 126t of the second conductive layer 126 is in a range from 25 Å to 45 Å, in some embodiments.

The metal filling layer 224a is disposed in the gate trench 104O. The material and forming method of the spacers 112 and the metal filling layer 224a have been described in the foregoing paragraph. Thus, details thereof are omitted here.

As shown in FIG. 4A, a bottom thickness B1 of the work function layer 200a (i.e., the first layer 202) at the bottom of the metal filling layer 224a is substantially equal to a sidewall thickness S1 of the work function layer 200a between the spacer 112 and the metal filling layer 224a.

Figure 4B:
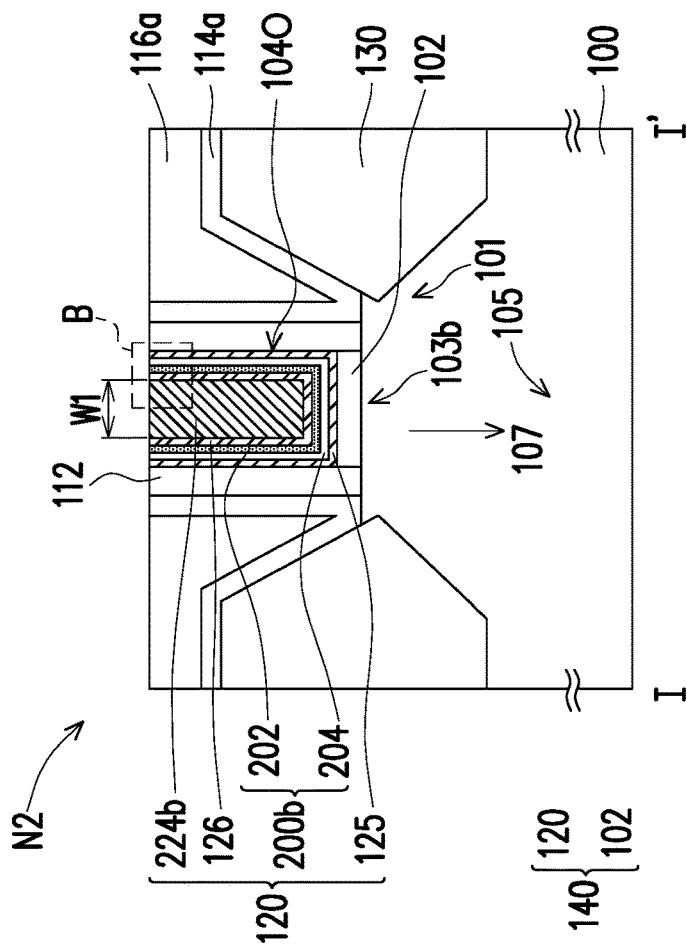

As shown in FIG. 4B and FIG. 5B, the arrangement, material and forming method of the second n-type FinFET N2 are similar to the arrangement, material and forming method of the first n-type FinFET N1. Thus, details thereof are omitted here. A difference therebetween lies in that the structure of a work function layer 200b of the second n-type FinFET N2 further includes a second layer 204. The second layer 204 is formed as the U-shaped structure and disposed between the first conductive layer 125 and the first layer 202. In some embodiments, the first layer 202 and the second layer 204 are referred as a second work function layer 200b.

In some embodiment, the second layer 204 includes one or more layers of TiN and TaN. In one embodiment, the second layer 204 includes a metal nitride layer (e.g., a TiN layer). In some embodiments, the second layer 204 and the first layer 202 include different materials. In some embodiments, a thickness 204t of the second layer 204 is in a range from 7 Å to 15 Å, and the second layer 204 may be formed by performing an ALD process. In some embodiments, the second work function layer 200b at the bottom of the metal filling layer 224a and the second work function layer 200b between the spacer 112 and the metal filling layer 224a have the same thickness.

Figure 4C:
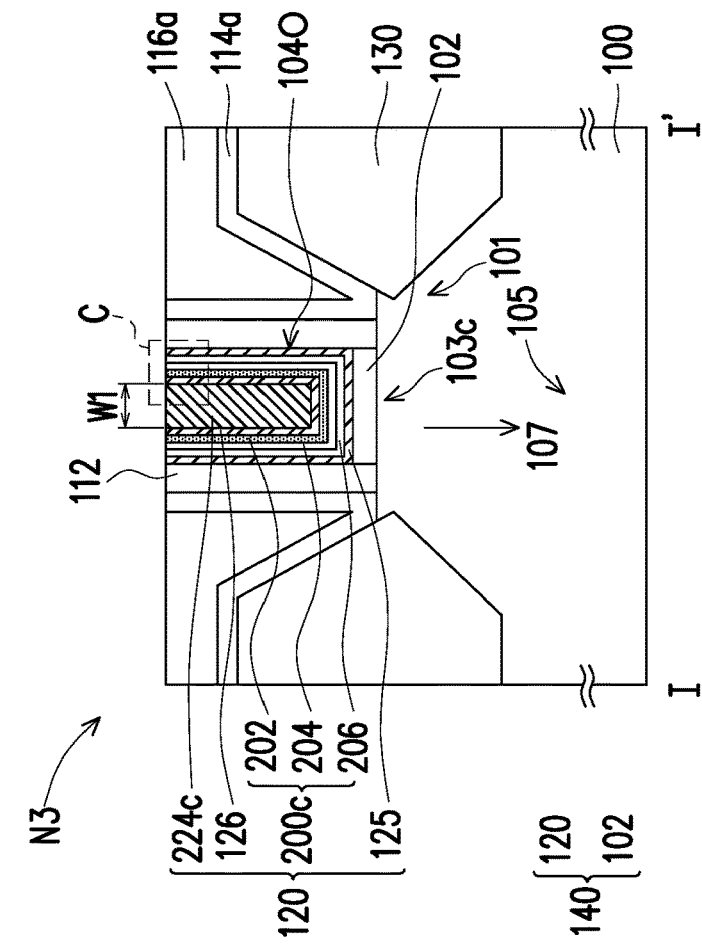

As shown in FIG. 4C and FIG. 5C, the arrangement, material and forming method of the third n-type FinFET N3 are similar to the arrangement, material and forming method of the second n-type FinFET N2. Thus, details thereof are omitted here. A difference therebetween lies in that the structure of a work function layer 200c of the third n-type FinFET N3 further includes a third layer 206, and the third layer 206 is formed as the U-shaped structure and disposed between the first conductive layer 125 and the second layer 204. In some embodiments, the first layer 202, the second layer 204 and the third layer 206 are referred as a third work function layer 200c. In some embodiment, the third layer 206 includes one or more layers of TiN and TaN. In one embodiment, the third layer 206 includes a TiN layer. In some embodiments, the third layer 206 and the first layer 202 include different materials. In some embodiments, a thickness 206t of the third layer 206 is in a range from 7 Å to 15 Å, and the third layer 206 may be formed by performing an ALD process. In some embodiments, the third work function layer 200c at the bottom of the metal filling layer 224a and the third work function layer 200c between the spacer 112 and the metal filling layer 224a have substantially the same thickness. Two adjacent layers may be treated as one "thick" layer. For example, when the third layer 206 and the second layer 204 are formed of the same material (e.g., TiN), the third layer 206 and the second layer 204 may be treated as one "thick" layer (e.g., a thick TiN layer).

As shown in FIGS. 4A to 4C, the second layer 204 and the third layer 206 may include the same material or different materials. On the other hand, the thicknesses of the first to third work function layers 200a, 200b, 200c are different. In some embodiments, the thickness of the first work function layer 200a for the first n-type FinFET N1 is the smallest, while the thickness of the third work function layer 200c for the third n-type FinFET N3 is the largest. As set forth above, by adjusting the thickness of the work function layer, threshold voltages (Vt) of the first to third n-type FinFETs N1, N2 and N3 may be adjusted to $0<Vn1<Vn2<Vn3$. That is, the threshold voltages of the first to third n-type FinFETs N1, N2 and N3 increases as the total thickness of the first to third work function layers 200a, 200b, 200c increases.

Referring to FIGS. 4A to 4C, in some embodiments, the gate electrodes 120 of the first to third n-type FinFETs N1, N2 and N3 have substantially the same width W. The widths W of the gate electrodes 120 of the first to third n-type FinFETs N1, N2 and N3 may be adjusted by the need. Since the gate electrodes 120 of the first to third n-type FinFETs N1, N2 and N3 have the same width W, the width W1 of the metal filling layers 224a to 224c decrease as the total thickness of the first to third work function layers 200a, 200b, 200c increases.

In addition, as shown in FIG. 4A, the semiconductor fin 101 has a doping concentration. The doping concentration at a region 103a near the gate structure 140 is substantially the same as the doping concentration at a region 105 away from the gate structure 140. For example, the region 103a is at a top surface of the semiconductor fin 101, or at a channel region of the first n-type FinFETs N1, while the region 105 is at a bottom surface of the semiconductor fin 101. In some embodiments, the semiconductor fin 101 is an epitaxial layer with a uniform doping concentration along a normal direction 107 of the top surface of the semiconductor fin 101. In some alternative embodiments, the semiconductor fin 101 is an undoped epitaxial layer. Other semiconductor fins 101 illustrated in FIGS. 4A and 4C have the same doping concentration distribution. In some embodiments, a region 103a (as shown in FIG. 4A) of the semiconductor fin 101 near the gate structure 140, a region 103b (as shown in FIG. 4B) of the semiconductor fin 101 near the gate structure 140, and a region 103c (as shown in FIG. 4C) of the semiconductor fin 101 near the gate structure 140 have substantially the same doping concentration. The region 103b/103c is at a top surface of the semiconductor fin 101, or at a channel region of the second n-type FinFETs N2/the third n-type FinFETs N3, for example.

FIG. 5D is exemplary cross-sectional view illustrating the structure of a work function layer of a first p-type FinFET P1 with a threshold voltage Vp1 (e.g., standard voltage). FIG. 5E is exemplary cross-sectional view illustrating the structure of a work function layer of a second p-type FinFET P2 with a threshold voltage Vp2 (e.g., low-voltage). FIG. 5F is exemplary cross-sectional view illustrating the structure of a work function layer of a third p-type FinFET P3 with a threshold voltage Vp3 (e.g., ultra-low voltage). Here, $Vp1<Vp2<Vp3<0V$.

Figure 4D:
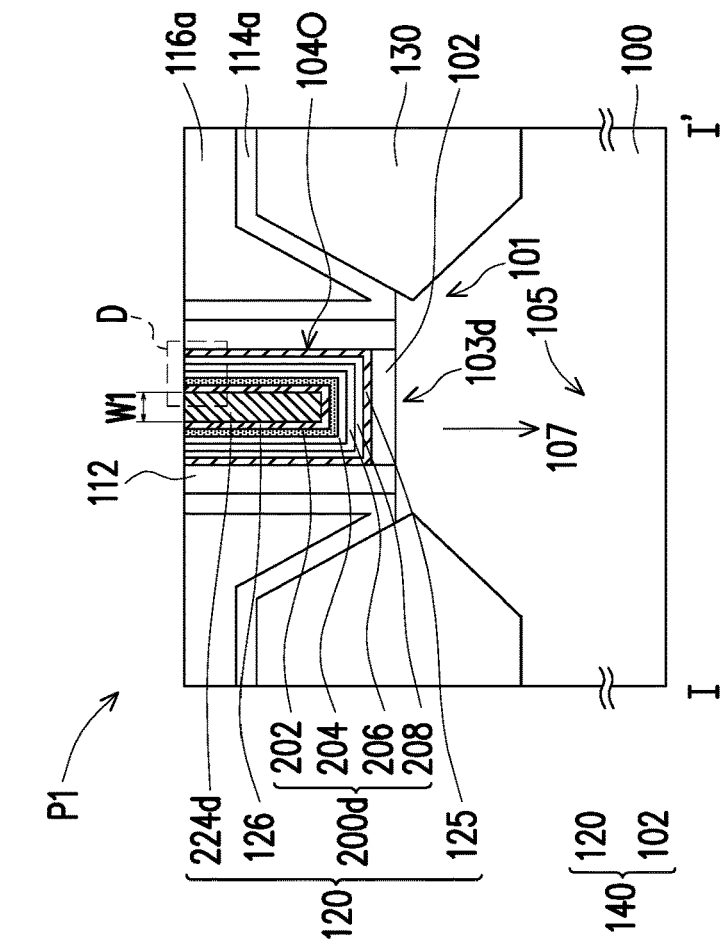
Figure 4F:
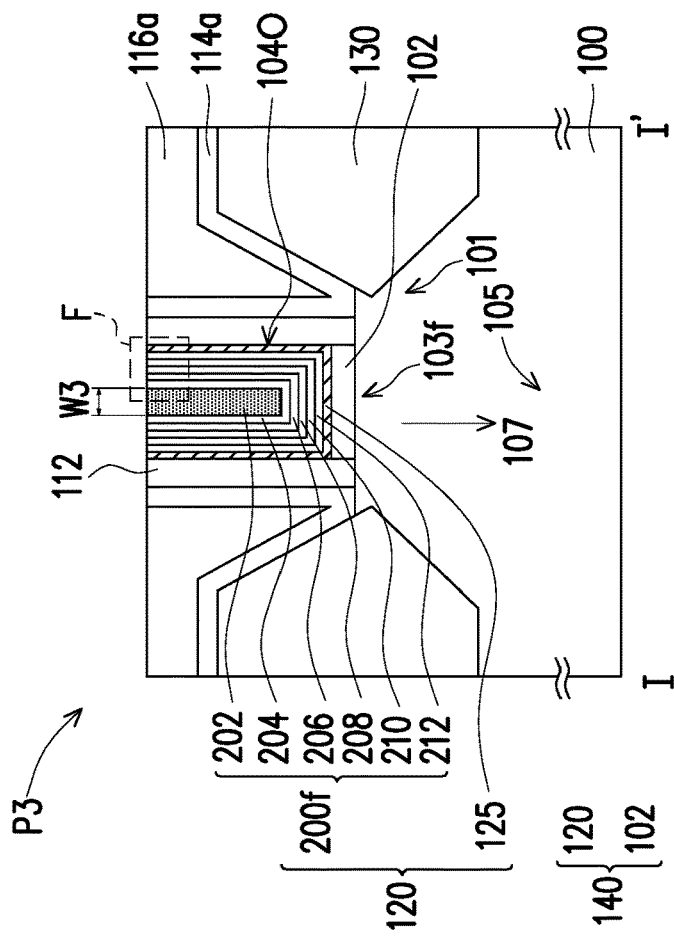

As shown in FIGS. 4D to 4F, the semiconductor fin 101 has a doping concentration. The doping concentration at a region 103e near the gate structure 140 is substantially the same as the doping concentration at a region 105 away from the gate structure 140. For example, the region 103d is at a top surface of the semiconductor fin 101, or at a channel region of the first p-type FinFETs P1, while the region 105 is at a bottom surface of the semiconductor fin 101. In some embodiments, the semiconductor fin 101 is an epitaxial layer with a uniform doping concentration along a normal direction 107 of the top surface of the semiconductor fin 101. Other semiconductor fins 101 illustrated in FIGS. 4D and 4F have the same doping concentration distribution. In some embodiments, a region 103d (as shown in FIG. 4D) of the semiconductor fin 101 near the gate structure 140, a region 103e (as shown in FIG. 4E) of the semiconductor fin 101 near the gate structure 140, and a region 103f (as shown in FIG. 4F) of the semiconductor fin 101 near the gate structure 140 have substantially the same doping concentration. The region 103e/103f is at a top surface of the semiconductor fin 101, or at a channel region of the second p-type FinFETs P2/the third p-type FinFETs P3, for example. In some embodiments, the semiconductor fins 101 are epitaxial layers with a uniform doping concentration along normal directions 107 of the top surfaces of the semiconductor fins 101 illustrated in FIGS. 4A and 4F.

As shown in FIG. 4D and FIG. 5D, the arrangement, material and forming method of the structure of the work function layer of the first p-type FinFET P1 are similar to the arrangement, material and forming method of the structure of the third work function layer 200c of the third n-type FinFET N3. Thus, details thereof are omitted here. A difference therebetween lies in that the structure of the work function layer 200d of the first p-type FinFET P1 further includes a fourth layer 208 formed as the U-shaped structure and disposed between the first conductive layer 125 and the third layer 206. In some embodiments, the first layer 202, the second layer 204, the third layer 206, and the fourth layer 208 are referred as a fourth work function layer 200d. The fourth layer 208 includes one or more layers of TiN and TaN. In one embodiment, the fourth layer 208 includes a TiN layer. In some embodiments, the fourth layer 208 and the first layer 202 include different materials. In some embodiments, a thickness 208t of the fourth layer 208 is in a range from 7 Å to 15 Å, and the fourth layer 208 may be formed by performing an ALD process. In some embodiments, the fourth work function layer 200d at the bottom of the metal filling layer 224a and the third work function layer 200c between the spacer 112 and the metal filling layer 224a have the same thickness.

As shown in FIG. 4E and FIG. 5E, the arrangement, material and forming method of the structure of the work function layer 200e of the second p-type FinFET P2 are similar to the arrangement, material and forming method of the structure of the work function layer 200d of the first p-type FinFET P1. Thus, details thereof are omitted here. A difference therebetween lies in that the structure of the work function layer 200e of the second p-type FinFET P2 further includes a fifth layer 210 formed as the U-shaped structure and disposed between the first conductive layer 125 and the fourth layer 208. In some embodiments, the first layer 202, the second layer 204, the third layer 206, the fourth layer 208, and the fifth layer 210 are referred as a fifth work function layer 200e. The fifth layer 210 includes one or more layers of TiN and TaN. In one embodiment, the fifth layer 210 includes a TiN layer. In some embodiments, the fifth layer 210 and the first layer 202 include different materials. In some embodiments, a thickness 210t of the fifth layer 210 is in a range from 7 Å to 15 Å, and the fifth layer 210 may be formed by performing an ALD process.

As shown in FIG. 4E, in some embodiments, the first conductive layer 125, the fifth layer 210, the fourth layer 208, the third layer 206, and the second layer 204 may be the U-shaped structure with the uniform thickness (i.e., the sidewall thickness and the bottom thickness are substantially the same). The first layer 202 may be the U-shaped structure with the uniform thickness (i.e., the sidewall thickness and the bottom thickness are substantially the same) or the non-uniform thickness (i.e., the sidewall thickness is less than the bottom thickness). In other words, the bottom thickness of the first layer 202 and the sidewall thickness of the first layer 202 may be different. Similarly, the second conductive layer 126 may be the U-shaped structure with the uniform thickness or the non-uniform thickness. In other words, in some embodiments, a bottom thickness B2 of the work function layer 200e at the bottom of the metal filling layer 224e and a sidewall thickness S2 of the work function layer 200e between the metal filling layer 224e and the spacer 12 have the same thickness. In other embodiments, a bottom thickness B2 of the work function layer 200e at the bottom of the metal filling layer 224e is greater than a sidewall thickness S2 of the work function layer 200e between the metal filling layer 224e and the spacer 12.

As shown in FIG. 4E, in the embodiments where the bottom thickness B2 of the work function layer 200e is greater than the sidewall thickness S2 of the work function layer 200e, the metal filling layer 224e is disposed in an upper portion of the gate trench 104O. Further, a width W2 of the metal filling layer 224e is less than the width W1 of one of the metal filling layers 224a to 224d.

As shown in FIG. 4F and FIG. 5F, the arrangement, material and forming method of the structure of the work function layer 200f of the third p-type FinFET P3 are similar to the arrangement, material and forming method of the structure of the work function layer 200e of the second p-type FinFET P2. Thus, details thereof are omitted here. A difference therebetween lies in that the structure of the work function layer 200f of the third p-type FinFET P3 further includes a sixth layer 212 formed as the U-shaped structure and disposed between the first conductive layer 125 and the fifth layer 210. In some embodiments, the first layer 202, the second layer 204, the third layer 206, the fourth layer 208, the fifth layer 210, and the sixth layer 212 are referred as a sixth work function layer 200f. The sixth layer 212 includes one or more layers of TiN and TaN. In one embodiment, the sixth layer 212 includes a TiN layer. In some embodiments, the sixth layer 212 and the first layer 202 include different materials. In some embodiments, a thickness 212t of the sixth layer 212 is in a range from 7 Å to 15 Å, and the sixth layer 212 may be formed by performing an ALD process.

As shown in FIG. 4F, in some embodiments, the remained space in the trench 104O is filled with the first layer 202. In other words, the total thickness of the work function layer 200f is getting thicker, so that the metal filling layer and the second conductive layer is not formed in the gate trench 104O. That is, the gate electrode 120 of the third p-type FinFET P3 includes the first conductive layer 125 and the work function layers 200f (including the first layer 202, the second layer 204, the third layer 206, the fourth layer 208, the fifth layer 210, and the sixth layer 212), and not includes the metal filling layer and the second conductive layer. In detail, the first layer 202 has a bar-shaped structure, each of the second layer 204, the third layer 206, the fourth layer 208, the fifth layer 210, the sixth layer 212, and the first conductive layer 125 has a U-shaped structure encapsulating sidewalls and a bottom surface of the first layer 202. In some embodiments, the width W3 of the first layer 202 in FIG. 4F is less than the width W4 of the first layer 202 in FIG. 4E.

As shown in FIGS. 5D to 5F, the fourth layer 208 to the sixth layer 212 may include the same material or different materials. At least two adjacent layers made of the same material may be treated as one "thick" layer. For example, when the sixth (or fifth, or fourth, or third) to second layers are formed of the same material (e.g., TiN), the sixth (or fifth, or fourth, or third) to second layers may be treated as one "thick" layer (e.g., a thick TiN layer).

As shown in FIGS. 5D to 5F, the widths of the fourth to sixth work function layers 200d, 200e, 200f are different. Further, the thickness of the sixth work function layer 200f for the third p-type FinFET P3 is larger than the thickness of the fourth work function layer 200d for the first p-type FinFET P1, and larger than the thickness of the fifth work function layer 200e for the second p-type FinFET P2. In some embodiments, the thickness of the fourth work function layer 200d for the first p-type FinFET P1 is the smallest, while the thickness of the sixth work function layer 200f for the third p-type FinFET P3 is the largest.

As shown in FIGS. 5A to 5F, the total thickness of the work function layer increases in the order of the first to sixth work function layers 200a to 200f, while the semiconductor fins 101 of the first to third n-type FinFETs N1, N2 and N3, and the first to third p-type FinFETs P1, P2, P3 are undoped, or have the same doping concentration. In other words, by adjusting the thickness of the work function layer, threshold voltages (Vt) of the first to third n-type FinFETs N1, N2 and N3 may be adjusted to 0<Vn1<Vn2<Vn3, and threshold voltages (Vt) for the first to third p-type FinFETs P1, P2 and P3 may be adjusted to Vp1<Vp2<Vp3<0, i.e. |Vp1|>|Vp2|>|Vp3|>0. That is, the threshold voltages of the first to third n-type FinFETs N1, N2 and N3 increases as the total thickness of the first to third work function layers 200a, 200b, 200c increases, while the absolute value of the threshold voltage of the first to third p-type FinFETs P1, P2, P3 decrease as the total thickness of the fourth to sixth work function layers 200d, 200e, 200f increases. On the other hand, when the total thickness of the first to sixth work function layers 200a to 200f increases, a depth of the metal filling layers 224a to 224e decreases, and the metal filling layer of third p-type FinFET P3 is even not formed in the gate trench 104O.

As shown in FIGS. 5A to 5F, in some embodiments, the work function layers 200b to 200f for the second and third n-type FinFETs N2, N3, and the first to third p-type FinFETs P1, P2, P3 are made of the same material with different thicknesses. In the case, the thickness of the first work function layers 200a for the first n-type FinFET N1 is smallest, while the thickness of the sixth work function layers 200f for the third p-type FinFET P3 is the largest.

In addition, in some embodiments, the semiconductor device includes one or more n-type FinFETs with different threshold voltages and/or one or more p-type FinFETs with different threshold voltages.

In some embodiments, the three n-type FinFETs and three p-type FinFETs are disposed in a core area or an I/O (input/output) area, in other embodiments. A thickness of the gate dielectric layer in the core area is less than a thickness of the gate dielectric layer in the I/O area.

FIGS. 6A to 6D are exemplary cross-sectional views illustrating various stages of the sequential fabrication process of a gate structure in accordance with some embodiments. FIG. 7 is a flow chart illustrating a method of manufacturing a gate structure of a semiconductor device in accordance with some embodiments. In FIGS. 6A to 6D, the fabrication processes for metal gate structures for n-type FinFETs are illustrated, but substantially the same fabrication processes may be applied to p-type FinFETs.

Figure 6C:
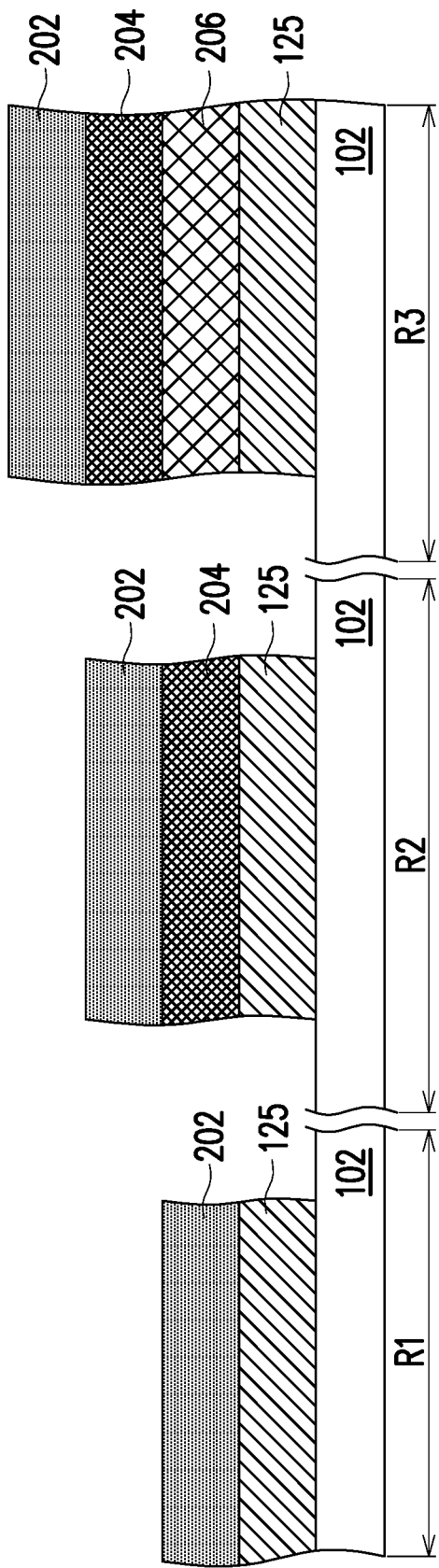
Figure 6D:
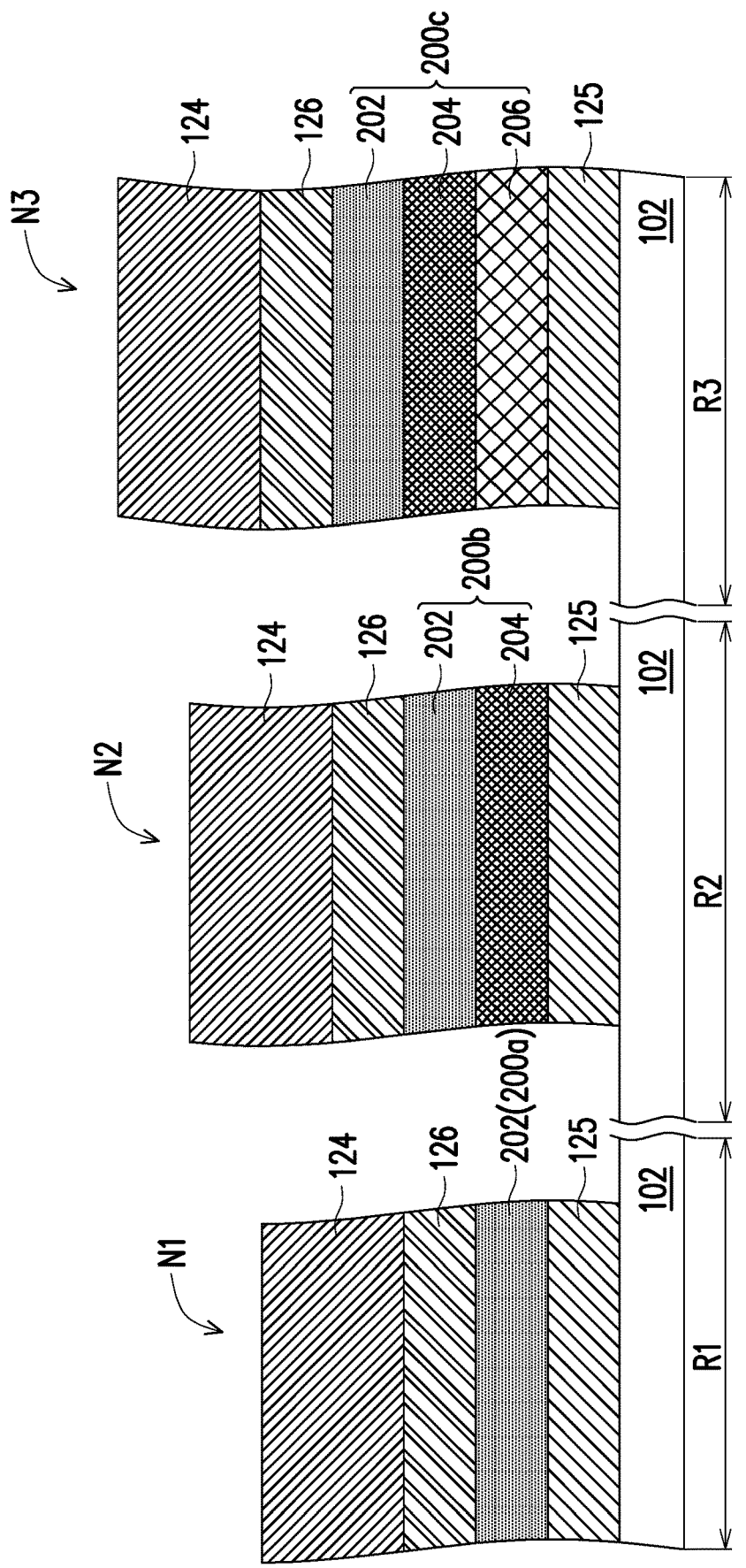
Figure 7:
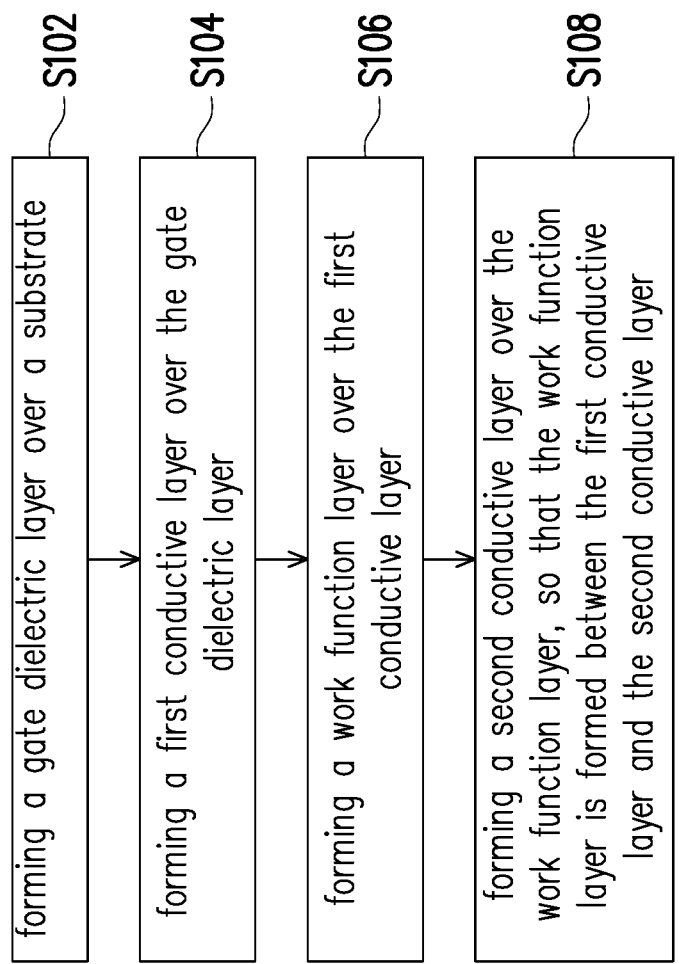
FIG. 7 is a flow chart illustrating a method of manufacturing a gate structure of a semiconductor device in accordance with some embodiments.

At Steps S102 and S104 in FIG. 7 and as shown in FIG. 6A, the gate dielectric layer 102 is formed over the substrate (not shown), and the first conductive layer 125 is formed over the gate dielectric layer 102. At Steps S106 and S108 in FIG. 7 and as shown in FIGS. 6B to 6D, the work function layer 200a, 200b and 200c for the first to third n-type FinFETs N1, N2 and N3 are formed over the first conductive layer 125, and the second conductive layer 126 is formed over the work function layer 200a, 200b and 200c.

In detail, as shown in FIG. 6A, the third layer 206 is formed over the first conductive layer 125 for the first to third n-type FinFETs N1, N2 and N3 (as shown in FIG. 6D) in regions R1 to R3. The third layer 206 formed on the first conductive layer 125 in regions R1 and R2 is removed by dry etching using a mask layer formed on the region R3. By the dry etching, the first conductive layers 125 for the first and second n-type FinFETs N1 and N2 in regions R1 and R2 are exposed.

As shown in FIG. 6B, the second layer 204 is formed over the first conductive layer 125 for the first and second n-type FinFETs N1 and N2 in regions R1 and R2, and over the third layer 206 for the third n-type FinFET N3 in region R3. Subsequently, the second layer 204 formed on the first conductive layer 125 for the first n-type FinFET N1 in the region R1 is removed by dry etching using a mask layer formed on the regions R2 and R3. By the dry etching, the first conductive layer 125 for the first n-type FinFET N1 in region R1 is exposed.

As shown in FIG. 6C, the first layer 202 is formed over the first conductive layer 125 for the first n-type FinFET N1 in the region R1, and over the second layer 204 for the second and third n-type FinFETs N2 and N3 in the regions R2 and R3. Subsequently, the second conductive layer 126 and the metal filling layer 124 are formed over the first layer 202, as shown in FIG. 6D.

The foregoing fabrication operations include a first operation of forming one or more material layers and etching the one or more material layers, thereby exposing the first conductive layer, and a second operation of forming a material layer and not etching the material layer. The fabrication operation for forming the work function layer 200a for the first n-type FinFET N1 includes two first operations (including forming and etching the third layer 206 and the second layer 204) and one second operation (including forming the first layer 202 and not etching the first layer 202), the fabrication operation for forming the work function layer 200b for the second n-type FinFET N2 includes one first operation (including forming and etching the third layer 206) and two second operations (including forming the second layer 204 and the first layer 202, and not etching the second layer 204 and the first layer 202), and the fabrication operation for forming the work function layer 200c for the third n-type FinFET N3 includes three second operations (including forming the third layer 206, the second layer 204 and the first layer 202, and not etching the third layer 206, the second layer 204 and the first layer 202) and no first operation.

In accordance with some embodiments of the present disclosure, a semiconductor device includes a first fin-type field effect transistor (FinFET). The first FinFET includes a first gate structure over a first semiconductor fin and the first gate structure includes a first work function layer. The first work function layer includes a first layer and a second layer. The first layer has a bar-shaped structure, the second layer has a U-shaped structure encapsulating sidewalls and a bottom surface of the first layer, and the first layer and the second layer include different materials.

In accordance with alternative embodiments of the present disclosure, a semiconductor device includes a first n-type FinFET with a threshold voltage Vn1, a second n-type FinFET with a threshold voltage Vn2, a third n-type FinFET with a threshold voltage Vn3, a first p-type FinFET with a threshold voltage Vp1, a second p-type FinFET with a threshold voltage Vp2, and a third p-type FinFET with a threshold voltage Vp3. The first n-type FinFET includes a first gate structure over a first semiconductor fin, and the first gate structure includes a first work function layer. The second n-type FinFET includes a second gate structure over a second semiconductor fin, and the second gate structure includes a second work function layer. The third n-type FinFET includes a third gate structure over a third semiconductor fin, and the third gate structure includes a third work function layer. The first p-type FinFET includes a fourth gate structure over a fourth semiconductor fin, and the fourth gate structure includes a fourth work function layer. The second p-type FinFET includes a fifth gate structure over a fifth semiconductor fin, and the fifth gate structure includes a fifth work function layer. The third p-type FinFET includes a sixth gate structure over a sixth semiconductor fin, and the sixth gate structure includes a sixth work function layer. $0<Vn1<Vn2<Vn3$ and $Vp1<Vp2<Vp3<0$. One of the first to sixth semiconductor fins has a substantially uniform doping concentration along a normal direction of a top surface of the one of the first to sixth semiconductor fins.

In accordance with yet alternative embodiments of the present disclosure, a method of manufacturing a semiconductor device includes following steps. A substrate is provided. An epitaxial layer is formed over the substrate. The epitaxial layer is patterned to form at least one semiconductor fin. A gate structure is formed across the at least one semiconductor fin. Strain layers are formed beside the gate structure, wherein a region of the at least one semiconductor fin near the gate structure and a region of the at least one semiconductor fin away from the gate structure are undoped or have substantially the same doping concentration.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first fin-type field effect transistor (FinFET) comprising a first gate structure over a first semiconductor fin, wherein the first gate structure comprises a first work function layer, and the first work function layer comprises a first layer and a second layer,
wherein the first layer has a bar-shaped structure, and the second layer has a U-shaped structure which encapsulates sidewalls and a bottom surface of the first layer, and the first layer and the second layer comprise different materials; and
a second FinFET comprising a second gate structure over a second semiconductor fin, wherein the second gate structure comprises a metal filling layer and a second work function layer which encapsulates sidewalls and a bottom surface of the metal filling layer, and a bottom thickness of the second work function layer is greater than a sidewall thickness of the second work function layer.

2. The semiconductor device of claim 1, wherein the first layer comprises TiAl, TaAl, HfAl, or a combination thereof, and the second layer comprises TiN, TaN or a combination thereof.

3. The semiconductor device of claim 1, wherein the second layer comprises a single layer structure or a multi-layer structure.

4. The semiconductor device of claim 1, wherein a thickness of the second layer is greater than a thickness of the first layer.

5. The semiconductor device of claim 1, wherein the first gate structure is free of a metal filling layer.

6. The semiconductor device of claim 1, further comprising
a third FinFET comprising a third gate structure over a third semiconductor fin, wherein the third gate structure comprises another metal filling layer and a third work function layer encapsulates sidewalls and a bottom surface of the another metal filling layer, and a bottom thickness of the third work function layer is substantially the same as a sidewall thickness of the third work function layer.

7. The semiconductor device of claim 6, wherein a region of the first semiconductor fin near the first gate structure, a region of the second semiconductor fin near the second gate structure, and a region of the third semiconductor fin near the third gate structure have substantially the same doping concentration.

8. The semiconductor device of claim 7, wherein a region of the first semiconductor fin near the first gate structure and a region of the first semiconductor fin away from the first gate structure have substantially the same doping concentration.

9. The semiconductor device of claim 7, wherein the first, second, and third work function layers have different thicknesses.

10. The semiconductor device of claim 9, wherein the first FinFET and the second FinFET are P-type FinFETs, a thickness of the second work function layer is thinner than a thickness of the first work function layer.

11. The semiconductor device of claim 10, wherein the third FinFET is a N-type FinFET, and a thickness of the third work function layer is thinner than the second work function layer.

12. The semiconductor device of claim 1, wherein the first semiconductor fin is an epitaxial layer with a uniform doping concentration along a normal direction of a top surface of the first semiconductor fin.

13. A semiconductor device, comprising:
a first n-type FinFET with a threshold voltage $Vn1$ comprising a first gate structure over a first semiconductor fin, wherein the first gate structure comprises a first work function layer;
a second n-type FinFET with a threshold voltage $Vn2$ comprising a second gate structure over a second semiconductor fin, wherein the second gate structure comprises a second work function layer;
a third n-type FinFET with a threshold voltage $Vn3$ comprising a third gate structure over a third semiconductor fin, wherein the third gate structure comprises a third work function layer;
a first p-type FinFET with a threshold voltage $Vp1$ comprising a fourth gate structure over a fourth semiconductor fin, wherein the fourth gate structure comprises a fourth work function layer;
a second p-type FinFET with a threshold voltage $Vp2$ comprising a fifth gate structure over a fifth semiconductor fin, wherein the fifth gate structure comprises a fifth work function layer; and
a third p-type FinFET with a threshold voltage $Vp3$ comprising a sixth gate structure over a sixth semiconductor fin, wherein the sixth gate structure comprises a sixth work function layer, wherein:
$0<Vn1<Vn2<Vn3$ and $Vp1<Vp2<Vp3<0$,
one of the first to sixth semiconductor fins has a substantially uniform doping concentration along a normal direction of a top surface of the one of the first to sixth semiconductor fins.

14. The semiconductor device of claim 13, wherein:
the first work function layer comprises a first layer; and
each of the second to sixth work function layers comprises the first layer and a second layer, the first layer is disposed over the second layer, and the first layer and the second layer comprise different materials.

15. The semiconductor device of claim 14, wherein a thickness of the second layer increases in the order of the second work function layer, the third work function layer, the fourth work function layer, the fifth work function layer, and the sixth work function layer.

16. The semiconductor device of claim 14, wherein the first layer comprises TiAl, TaAl, HfAl, or a combination thereof, and the second layer comprises TiN, TaN or a combination thereof.

17. The semiconductor device of claim 13, wherein
the first gate structure comprises a metal filling layer encapsulated by the first work function layer, and a bottom thickness of the first work function layer is substantially equal to a sidewall thickness of the first work function layer,
the fifth gate structure comprises another metal filling layer encapsulated by the fifth work function layer, and a bottom thickness of the fifth work function layer is greater than a sidewall thickness of the fifth work function layer, and
the sixth gate structure is free of a metal filling layer, wherein the sixth work function layer comprises a first layer and a second layer, the first layer has a bar-shaped structure, and the second layer has a U-shaped structure which encapsulates sidewalls and a bottom surface of the first layer.

18. A method of manufacturing a semiconductor device, comprising:
providing a substrate;
forming an epitaxial layer over the substrate;
patterning the epitaxial layer to form a plurality of semiconductor fins;
forming a first gate structure across a first semiconductor fin of the semiconductor fins, wherein the first gate structure comprises a first work function layer, and the first work function layer comprises a first layer and a second layer, wherein the first layer has a bar-shaped structure, and the second layer has a U-shaped structure which encapsulates sidewalls and a bottom surface of the first layer, and the first layer and the second layer comprise different materials;
forming a second gate structure across a second semiconductor fin of the semiconductor fins, wherein the second gate structure comprises a metal filling layer and a second work function layer which encapsulates sidewalls and a bottom surface of the metal filling layer, and a bottom thickness of the second work function layer is greater than a sidewall thickness of the second work function layer; and
forming strain layers beside the first and second gate structures.

19. The method of claim 18, further comprising forming a third gate structure over a third semiconductor fin, wherein the third gate structure comprises another metal filling layer and a third work function layer encapsulates sidewalls and a bottom surface of the another metal filling layer, and a bottom thickness of the third work function layer is substantially the same as a sidewall thickness of the third work function layer.

20. The method of claim 19, wherein a region of the first semiconductor fin near the first gate structure, a region of the second semiconductor fin near the second gate structure, and a region of the third semiconductor fin near the third gate structure have substantially the same doping concentration.

* * * * *